United States Patent
Bi et al.

(10) Patent No.: US 10,566,445 B2
(45) Date of Patent: Feb. 18, 2020

(54) GATE SPACER AND INNER SPACER FORMATION FOR NANOSHEET TRANSISTORS HAVING RELATIVELY SMALL SPACE BETWEEN GATES

(71) Applicant: International Business Machines Corporation, Armonk, NY (US)

(72) Inventors: Zhenxing Bi, Niskayuna, NY (US); Kangguo Cheng, Schenectady, NY (US); Nicolas J. Loubet, Guilderland, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/944,322

(22) Filed: Apr. 3, 2018

(65) Prior Publication Data
US 2019/0305106 A1    Oct. 3, 2019

(51) Int. Cl.
*H01L 29/66*    (2006.01)
*H01L 29/78*    (2006.01)
*H01L 29/06*    (2006.01)

(52) U.S. Cl.
CPC ...... *H01L 29/6656* (2013.01); *H01L 29/0649* (2013.01); *H01L 29/0673* (2013.01); *H01L 29/6653* (2013.01); *H01L 29/6681* (2013.01); *H01L 29/66553* (2013.01); *H01L 29/7853* (2013.01)

(58) Field of Classification Search
None
See application file for complete search history.

(56) References Cited

U.S. PATENT DOCUMENTS

| | | |
|---|---|---|
| 7,700,419 B2 | 4/2010 | Anwar et al. |
| 8,080,456 B2 | 12/2011 | Barwicz et al. |
| 8,389,416 B2 | 3/2013 | Luong |
| 8,472,239 B2 | 6/2013 | Chang et al. |
| 8,809,131 B2 | 8/2014 | Bangsaruntip et al. |
| 9,362,355 B1 | 6/2016 | Cheng et al. |
| 9,461,114 B2 | 10/2016 | Obradovic et al. |
| 9,484,447 B2 | 11/2016 | Kim et al. |
| 9,620,590 B1 | 4/2017 | Bergendahl et al. |
| 9,647,139 B2 | 5/2017 | Doris et al. |
| 9,660,028 B1 | 5/2017 | Cheng et al. |
| 9,799,748 B1 * | 10/2017 | Xie ............... H01L 21/30604 |

(Continued)

OTHER PUBLICATIONS

Cheng et al., "Inner Spacer for Nanosheet Transistors," U.S. Appl. No. 15/826,841, filed Nov. 30, 2017.

(Continued)

*Primary Examiner* — William A Harriston
(74) *Attorney, Agent, or Firm* — Cantor Colburn LLP; Vazken Alexanian (57) ABSTRACT

Embodiments of the invention are directed to method of fabricating a semiconductor device. A non-limiting embodiment of the method includes performing fabrication operations to form a nanosheet field effect transistor (FET) device on a substrate, wherein the fabrication operations include forming gate spacers along a gate region of the nanosheet FET device, wherein each of the gate spacers comprises an upper segment and a lower segment.

10 Claims, 7 Drawing Sheets

(56) References Cited

U.S. PATENT DOCUMENTS

| | | |
|---|---|---|
| 9,859,368 B2 | 1/2018 | Kim et al. |
| 9,881,998 B1 | 1/2018 | Cheng et al. |
| 9,923,055 B1 | 3/2018 | Cheng et al. |
| 2008/0135949 A1 | 6/2008 | Lo et al. |
| 2012/0007051 A1 | 1/2012 | Bangsaruntip et al. |
| 2012/0138886 A1 | 6/2012 | Kuhn et al. |
| 2014/0339611 A1 | 11/2014 | Leobandung |
| 2016/0071729 A1 | 3/2016 | Hatcher et al. |
| 2016/0126310 A1 | 5/2016 | Rodder et al. |
| 2016/0365411 A1* | 12/2016 | Yeh .................... H01L 29/0673 |
| 2017/0047452 A1 | 2/2017 | Kim et al. |
| 2017/0069481 A1 | 3/2017 | Doris et al. |
| 2017/0200738 A1* | 7/2017 | Kim .................... H01L 27/1203 |
| 2017/0213905 A1 | 7/2017 | Lee et al. |
| 2017/0221992 A1 | 8/2017 | Chang et al. |
| 2017/0263704 A1 | 9/2017 | Kittl et al. |
| 2017/0317169 A1 | 11/2017 | Bentley et al. |
| 2017/0330934 A1 | 11/2017 | Zhang et al. |
| 2017/0365604 A1 | 12/2017 | Suh et al. |
| 2019/0006485 A1* | 1/2019 | Kim .................... H01L 29/6656 |

OTHER PUBLICATIONS

Lee et al., "Gate Spacer and Inner Spacer Formation for Nanosheet Transistors Having Relatively Small Space Between Adjacent Gates," U.S. Appl. No. 15/969,855, filed May 3, 2018.

List of IBM Patents or Patent Applications Treated as Related; Date Filed: Apr. 3, 2018, 2 pages.

Anonymous, "Improved Spacer for Nano Sheet Transistors," IPCOM000244655D, Jan. 2016, 5 pages.

Bi et al., "Gate Spacer and Inner Spacer Formation for Nanosheet Transistors Having Relatively Small Space Between Gates," U.S. Appl. No. 16/515,759, filed Jul. 18, 2019.

List of IBM Patents or Patent Applications Treated as Related; Date Filed: Jul. 18, 2019, 2 pages.

* cited by examiner

GATE SPACER AND INNER SPACER FORMATION FOR NANOSHEET TRANSISTORS HAVING RELATIVELY SMALL SPACE BETWEEN GATES

BACKGROUND

The present invention relates in general to fabrication methods and resulting structures for semiconductor devices. More specifically, the present invention relates to fabrication methods and resulting structures for forming the offset gate spacers (or outer spacers) and the inner spacers in nanosheet transistors having relatively small spaces (e.g., below about 10 nm) between the gates of adjacent nanosheet transistors during intermediate fabrication steps.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions for improved control of channel current flow. Nanosheet transistor configurations enable fuller depletion in the nanosheet channel regions and reduce short-channel effects.

SUMMARY

Embodiments of the invention are directed to method of fabricating a semiconductor device. A non-limiting embodiment of the method includes performing fabrication operations to form a nanosheet field effect transistor (FET) device on a substrate, wherein the fabrication operations include forming gate spacers along a gate region of the nanosheet FET device, wherein each of the gate spacers comprises an upper segment and a lower segment.

Embodiments of the invention are directed to a method of fabricating a semiconductor device. A non-limiting embodiment of the method includes performing fabrication operations to form nanosheet FET devices on a substrate. The fabrication operations include forming gate spacers along a gate region of the nanosheet FET device. Inner spacers are formed between channel nanosheets of the nanosheet FET device. Each of the gate spacers includes an upper segment and a lower segment. The upper segment includes a second type of material, the lower segment includes a first type of material, and the inner spacers include the first type of material.

Embodiments of the invention are directed to a nanosheet FET device. A non-limiting example of the nanosheet field FET device includes gate spacers formed along a gate region of the nanosheet FET device, wherein each of the gate spacers includes an upper segment and a lower segment.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 2-15 depict cross-sectional views of a section of a substrate/wafer after various fabrication operations to form the nanosheet transistors shown in FIG. 1 according to embodiments of the invention, in which:

DETAILED DESCRIPTION

It is understood in advance that although this invention includes a detailed description of exemplary gate-all-around (GAA) nanosheet FET architectures having silicon (Si) channel nanosheets and SiGe sacrificial nanosheets, embodiments of the invention are not limited to the particular FET architectures or materials described in this specification.

Rather, embodiments of the present invention are capable of being implemented in conjunction with any other type of nanosheet/nanowire FET architecture or materials now known or later developed. In this detailed description and in the claims, the terms nanosheet and nanowire are treated as being synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets are typically SiGe and the sacrificial nanosheets are typically Si. In some implementations, the channel nanosheet of a p-FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FET(s) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs having increasingly smaller gate pitch. For example, known inner spacer formation techniques may or may not work when the gate pitch becomes smaller and smaller. In some nanosheet transistor architectures, inner spacers are provided between adjacent ones of the stacked channel nanosheets at end regions thereof. The inner spacers protect the channel nanosheets from the source and drain regions, and also provide electric isolation and support between the channels. As the gate pitch for nanosheet transistors continues to decrease, the space between the gates of adjacent devices on the chip is very small (e.g., 6 nm for current 48 cpp (contacted poly/gate pitch), 2 nm for 44 cpp, etc.), which makes it challenging to apply known inner spacer fabrication techniques that were developed for gate pitches below about 44 CPP.

Turning now to an overview of aspects of the invention, embodiments of the invention provides fabrication methods and resulting structures for forming the offset gate spacers (or outer spacers) and the inner spacers in nanosheet transistors having relatively small spaces between the gates of adjacent nanosheet transistors (e.g., below about 7 nm). In embodiments of the invention, a dummy spacer is utilized to, in effect, "bookmark" or "reserve" the place for the outer spacers. In downstream fabrication operations, the dummy (or placeholder) spacer is replaced with two-segment outer spacers and inner spacers. In embodiments of the invention, the lower segment of the two-segment outer spacers is the same material as the inner spacers. The likelihood of gate pinch-off is reduced and spacer structural integrity is increased by utilizing a self-aligned spacer etch to remove the excess inner spacer material covering the Si channel nanosheet with selectivity to the top-segment of the two-segment outer spacers.

Figure 1:
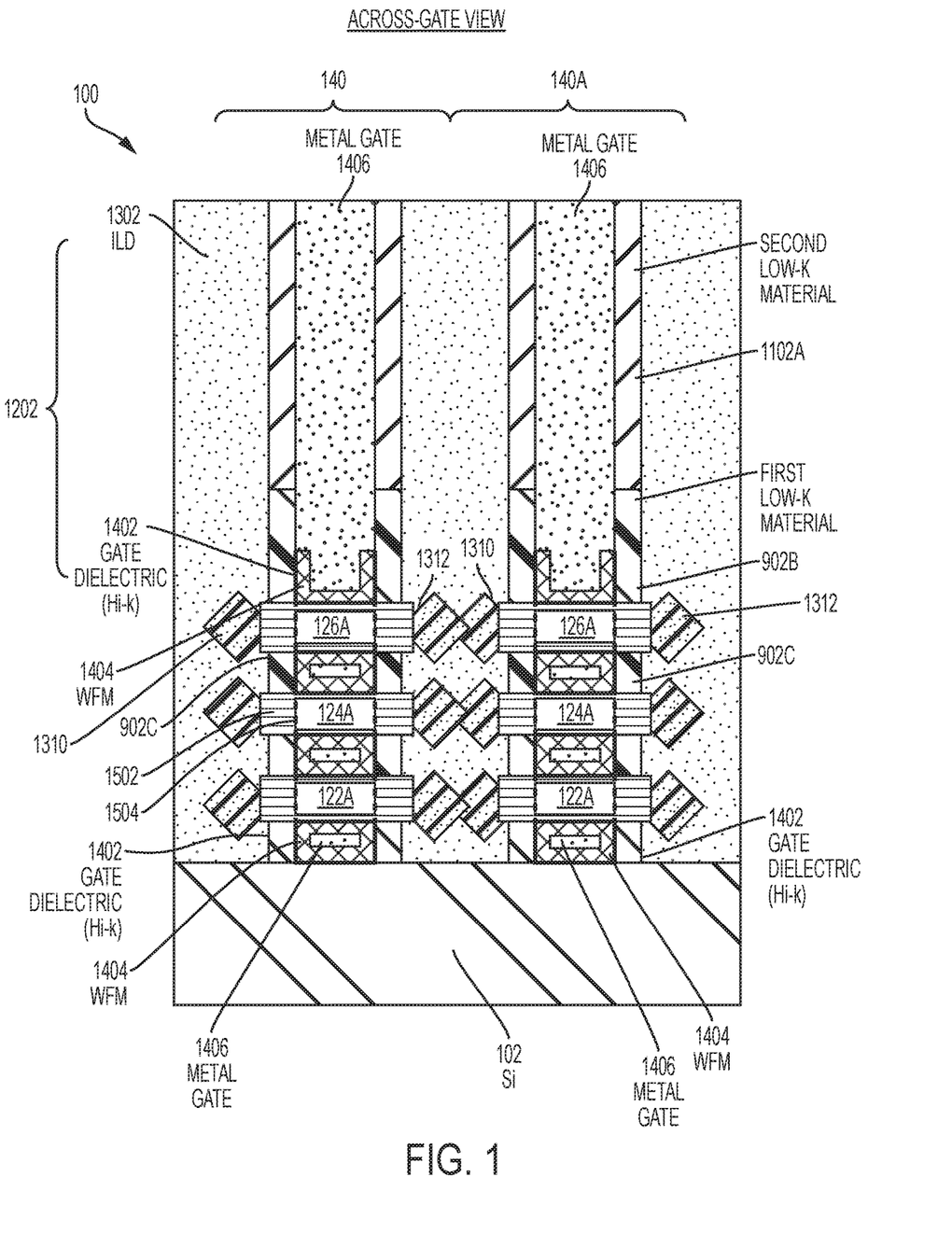
FIG. 1 depicts a cross-sectional view of a section of a substrate/wafer having nanosheet transistors formed thereon, wherein the nanosheet transistors include offset gate spacers (or outer spacers) and inner spacers according to embodiments of the invention.

Turning now to a more detailed description of fabrication operations according to aspects of the invention, FIG. 1 depicts a cross-sectional view of a section 100 of a substrate/wafer 102 having nanosheet transistors 140, 140A formed thereon, wherein each of the nanosheet transistors 140, 140A includes offset gate spacers (or outer spacers) 1202 (best shown in FIG. 13) and inner spacers 902C according to embodiments of the invention. In the illustrated embodiments, the substrate 102 includes a bulk silicon material. Alternatively, the substrate 102 can be implemented in a semiconductor-on-insulator (SOI) configuration. For ease of illustration and description, two nanosheet transistors 140, 140A are shown on the substrate 102. However, it should be understood that the teachings in this detailed description can be applied to the fabrication of a substrate/wafer having any number of nanosheet transistors formed thereon. The nanosheet transistors 140, 140A are substantially identical, and so reference numbers for elements of one of the nanosheet transistors 140, 140A applies equally to the corresponding element on the other nanosheet transistor.

As shown in FIG. 1, and in accordance with aspects of the invention, each nanosheet transistor 140, 140A includes nanosheet channels, 122B, 124B, 126B; source/drain (S/D) regions 1310, 1312 at end regions of the nanosheet channels, 122B, 124B, 126B; metal gate structures 1406, work function metal (WFM) regions 1404, and gate dielectric (e.g., high-k) layers 1402 that extend over and around the nanosheet channels, 122B, 124B, 126B in a GAA configuration; offset gate spacers 1202 (best shown in FIG. 13) formed from upper segments 1102A and lower segments 902B; and inner spacers 902C, configured and arranged as shown. An interlayer dielectric (ILD) region 1302 is formed over the substrate 102 and the nanosheet transistors 140, 140A.

In embodiments of the invention, and as described in greater detail in connection with the fabrication operations shown in FIGS. 2-15, fabrication methods and resulting structures are described for forming the offset gate spacers (or outer spacers) 1202 and the inner spacers 902C in nanosheet transistors 140, 140A, wherein relatively small space is provided between upper regions of the metal gates 1406 of adjacent nanosheet transistors (e.g., below about 10 nm). In embodiments of the invention, dummy spacers 502A (shown in FIG. 7) are utilized to, in effect, "bookmark" or "reserve" the place for the offset gate spacers 1202. In downstream fabrication operations, the dummy spacers are replaced with two-segment outer spacers 1202 and inner spacers 902C. In embodiments of the invention, the upper segment 1102a of the two-segment offset gate spacer 1202 is a different material than the lower segment 902B of the two-segment offset gate spacer 1202 and the lower segment 902B is the same material as the inner spacer 902C. The likelihood of gate pinch-off is reduced and spacer structural integrity is increased by utilizing a self-aligned spacer etch to remove the excess inner spacer material covering the Si channel nanosheets 122B, 124B, 126B with selectivity to the upper segment 1102A. The selectivity of the self-aligned spacer etch is facilitated because the upper segment 1102A is different material than the lower segment 902B and the inner spacer 902C.

Figures 2, 3A:
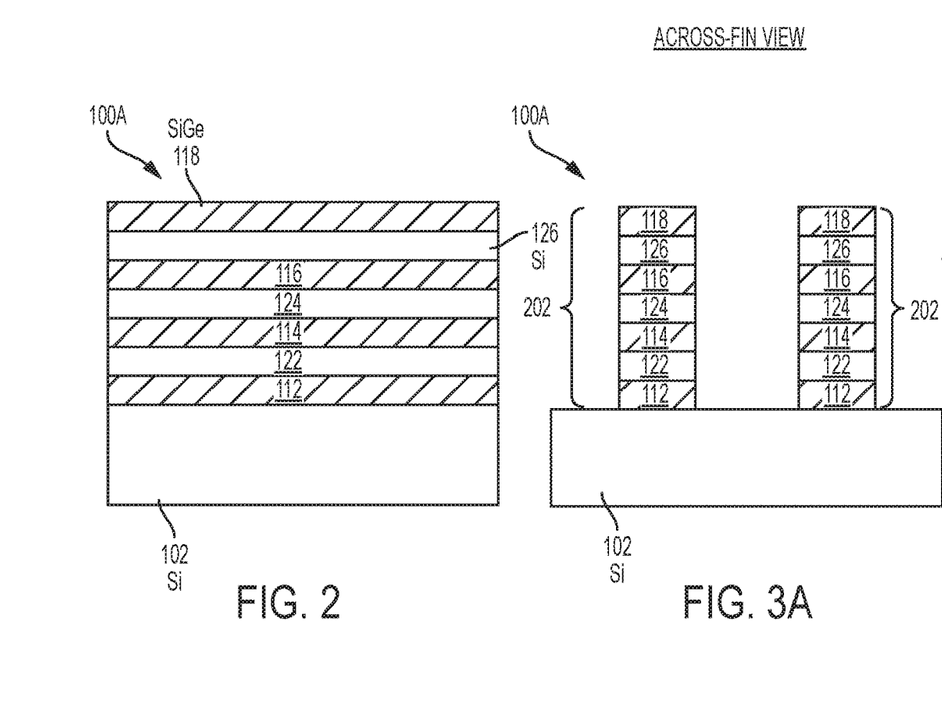
FIG. 2 depicts a cross-sectional view of a semiconductor structure after initial fabrication stages according to embodiments of the invention.
FIG. 3A depicts a cross-sectional, across-the-fin view of the semiconductor structure after fabrication stages according to embodiments of the invention.

FIGS. 2-15 depict cross-sectional views of section 100 of the substrate/wafer 102 (shown in FIG. 1) after various fabrication operations to form the nanosheet transistors 140, 140A on the same substrate 102 in accordance with embodiments of the invention. As shown in FIG. 2, after initial stage an alternating series of SiGe sacrificial nanosheet layers 112, 114, 116, 118 and Si nanosheet layers 122, 124, 126 are formed in a stack on the Si substrate 102. In some embodiments of the invention, the SiGe nanosheet layers 112, 114, 116, 118 can be within a range from SiGe 20% to SiGe 40%. The notations "SiGe 20%" and "SiGe 40%" are used to indicate that 20% of the SiGe material is Ge, or that 40% of the SiGe material is Ge, respectively.

In embodiments of the invention, the alternating nanosheet layers 112, 122, 114, 124, 116, 126, 118 depicted in FIG. 2 can be formed by epitaxially growing one layer and then the next until the desired number and desired thicknesses of the nanosheet layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 3B:
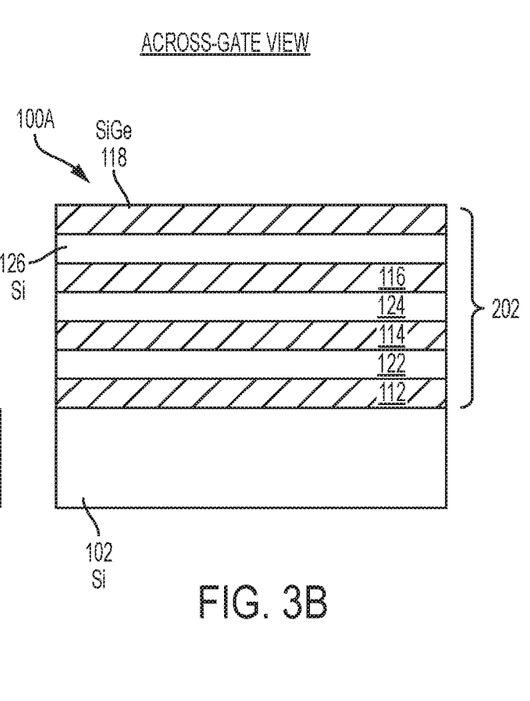
FIG. 3B depicts a cross-sectional, across-the-gate view of the semiconductor structure shown in FIG. 3A, wherein the across-the-gate view results from rotating the across-the-fin view 90 degrees counterclockwise into the page.

FIG. 3A depicts a cross-sectional, across-the-fin view of the section/portion 100A of the substrate 102 after fabrication stages according to embodiments of the invention, and FIG. 3B depicts a cross-sectional, across-the-gate view of the section/portion 100A of the substrate 102 shown in FIG. 3A, wherein the across-the-gate view results from rotating the across-the-fin view 90 degrees counterclockwise into the page. In FIGS. 3A and 3B, known semiconductor fabrication operations have been used to etch or recess the alternating nanosheet layers 112, 122, 114, 124, 116, 126, 118 shown in FIG. 2 to form multiple intermediate elongated columns 202. In an example fabrication process, a patterned hard mask (not shown) is deposited over the alternating nanosheet layers 112, 122, 114, 124, 116, 126, 118. The pattern of the hard mask defines the footprints of the multiple intermediate elongated columns 202 shown in FIGS. 3A and 3B. FIG. 3A is a view of the intermediate elongated columns 202 by a person standing in front the narrowest sidewalls of the intermediate elongated columns 202 (i.e., in the across-fin direction). FIG. 3B is a view of one of the intermediate elongated columns 202 by a person standing in front of the elongated sidewall of one of the intermediate elongated columns 202 (i.e., in the across-gate direction). An etch (e.g., an RIE) or a recess is applied to remove the portions of the alternating nanosheet layers that are not covered by the patterned hard mask, thereby forming the intermediate elongated columns 202.

Figure 4:
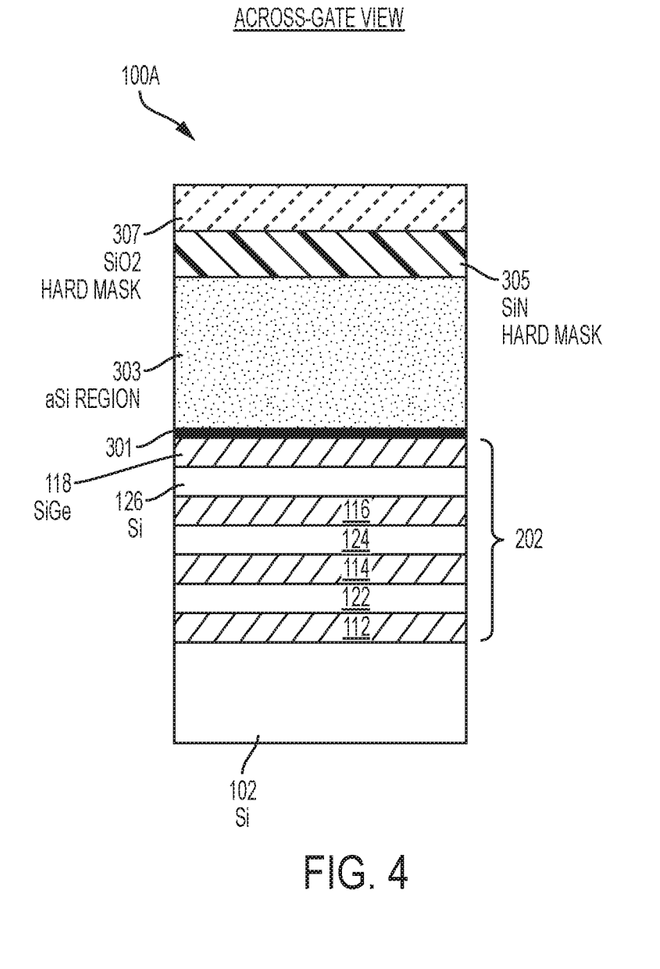
FIG. 4 depicts a cross-sectional, across-the gate view of the semiconductor structure after fabrication stages according to embodiments of the invention.

The remaining FIGS. 4-15 are the cross-sectional view, across-the-gate view used in FIG. 3B. In FIG. 4, known semiconductor fabrication operations have been used to form a thin gate dielectric 302, an amorphous silicon (a-Si) region 303, a SiN hard mask layer 305, and a $SiO_2$ hard mask layer 307, configured and arranged as shown. Although only one of the intermediate elongated fin-shaped columns 202 is shown in the two-dimensional (X-axis and Y-axis) cross-sectional diagram shown in FIG. 4, multiple additional intermediate elongated fin-shaped columns (not shown) are positioned behind the intermediate elongated fin-shaped column 202 and extend into the page in the Y-axis direction. The additional intermediate elongated fin-shaped columns positioned behind the intermediate elongated fin-shaped column 202 are substantially the same as the intermediate elongated fin-shaped column 202. Similarly, although the a-Si region 303 is depicted in a cross-sectional, two-dimensional view in FIG. 4, in practice, the aSi region 303 is formed over and around the elongated sidewalls of each of the intermediate elongated fin-shaped columns 202.

Figure 5:
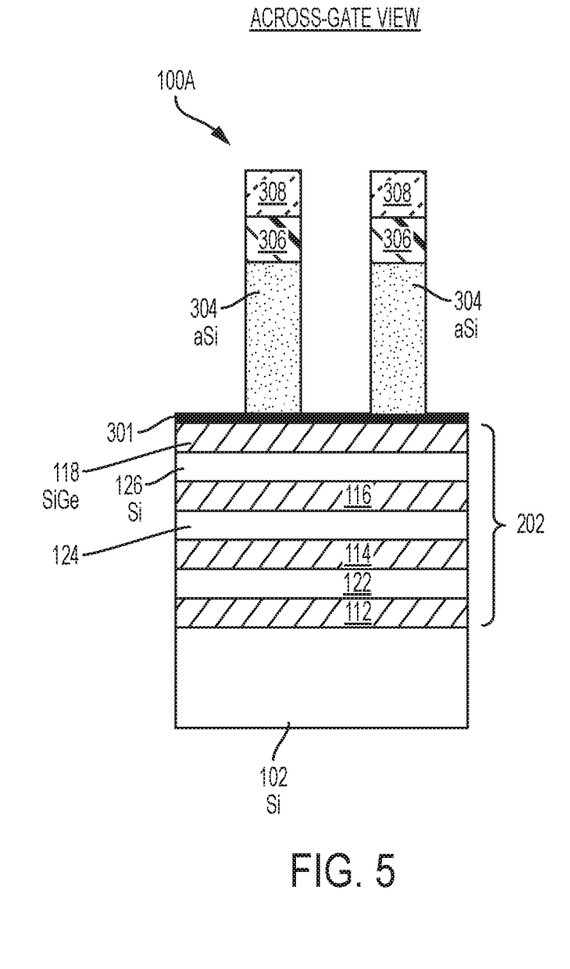
FIG. 5 depicts a cross-sectional, across-the gate view of the semiconductor structure after fabrication stages according to embodiments of the invention.

In FIG. 5, known semiconductor fabrication operations have been used to form the dummy gates 304. For example, the dummy gates 304 can be formed by patterning the SiN hard mask layer 305 (shown in FIG. 4) and the $SiO_2$ hard mask layer 307 (shown in FIG. 4) to form the hard masks 306, 308. An etching process (e.g., an RIE) is applied to the a-Si region 303 (shown in FIG. 4) to form the dummy gates 304.

Figure 6:
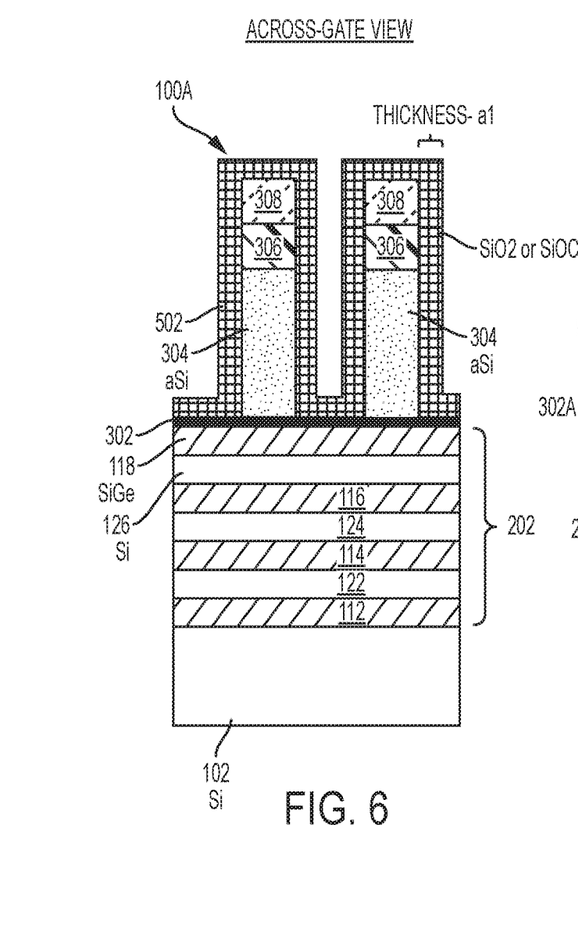
FIG. 6 depicts a cross-sectional, across-the gate view of the semiconductor structure after fabrication stages according to embodiments of the invention.
Figure 7:
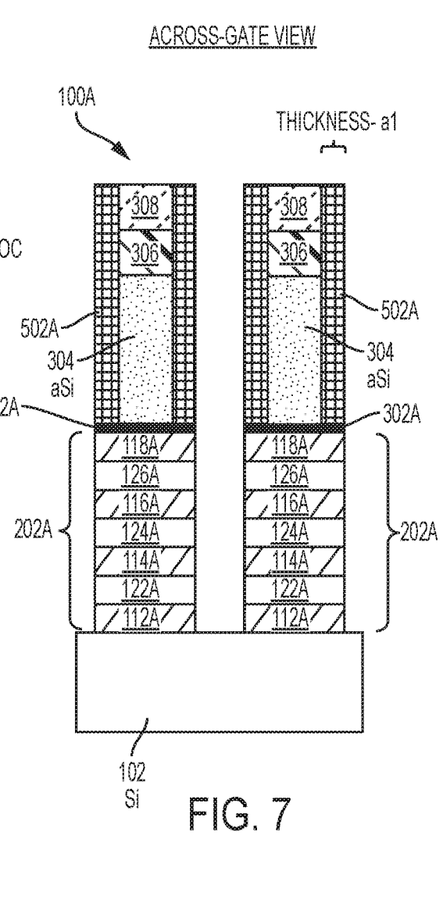
FIG. 7 depicts a cross-sectional, across-the gate view of the semiconductor structure after fabrication stages according to embodiments of the invention.

In FIGS. 6 and 7, known fabrication operations have been used to form the dummy offset gate spacers 502A. For example, the dummy offset spacers 502A (shown in FIG. 7) can be formed by a conformal deposition (shown in FIG. 6) of a dielectric material 502 (e.g., silicon oxide, silicon nitride, silicon oxynitride, SiBCN, SiOCN, SiOC, or any suitable combination of those materials) to a thickness a1, followed by a directional etch (e.g., RIE) to form the dummy offset gate spacers 502A shown in FIG. 7. In embodiments of the invention, the dummy offset gate spacers 502A can be formed using a spacer pull down formation process.

Fabrication of the dummy offset gate spacers 502A result in exposed surfaces of the gate dielectric 302 (shown in FIG. 6). In FIG. 7, an etch or a recess has been applied to the exposed surfaces of the gate dielectric 302 (shown in FIG. 6) and the intermediate elongated columns 202 (shown in FIG. 6) to form the gate dielectric 302A and two adjacent sets of the final fin-shaped columns 202A. The etch/recess forms the gate dielectric 302A and the fin-shaped columns 202A by etching/recessing the portions of the intermediate elongated fin-shaped columns 202 and the gate dielectric 302 that are not covered by the dummy gates 304 and the dummy offset gate spacers 502A. Each of the fin-shaped columns 202A includes a stack of alternating SiGe/Si nanosheet regions 112A, 122A, 114A, 124A, 116A, 126A, 118A.

Figure 8:
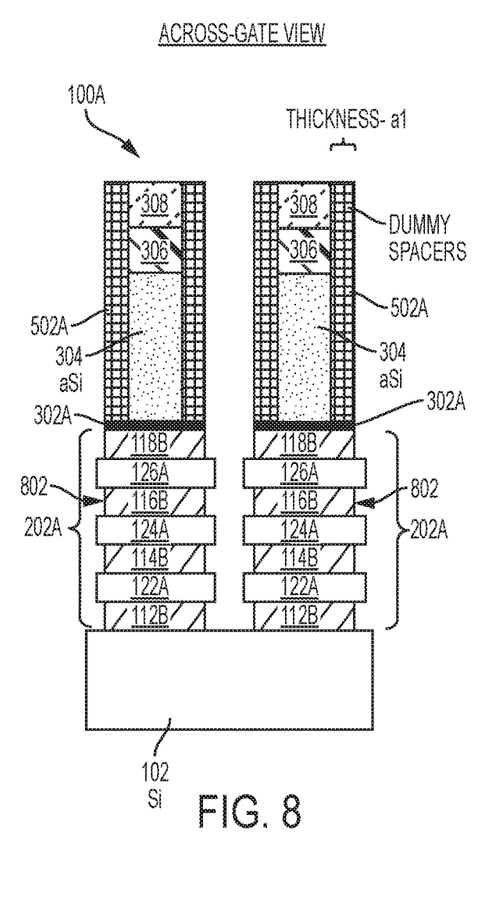
FIG. 8 depicts a cross-sectional, across-the gate view of the semiconductor structure after fabrication stages according to embodiments of the invention.

In FIG. 8, known semiconductor fabrication processes have been used to form pull back end region cavities 802 in the SiGe sacrificial nanosheet regions 114A, 116A, 118A (shown in FIG. 7) from underneath the dummy offset gate spacers 502A using, for example, a hydrogen chloride (HCL) gas isotropic etch process, which etches SiGe without attacking Si. The end region cavities 802 are formed to thicknesses that substantially match the desired thickness of the to-be-formed inner spacers 902C (shown in FIG. 14). After formation of the end region cavities 802, sacrificial nanosheet central regions 112B, 114B, 116B, 118B remain.

Figure 9:
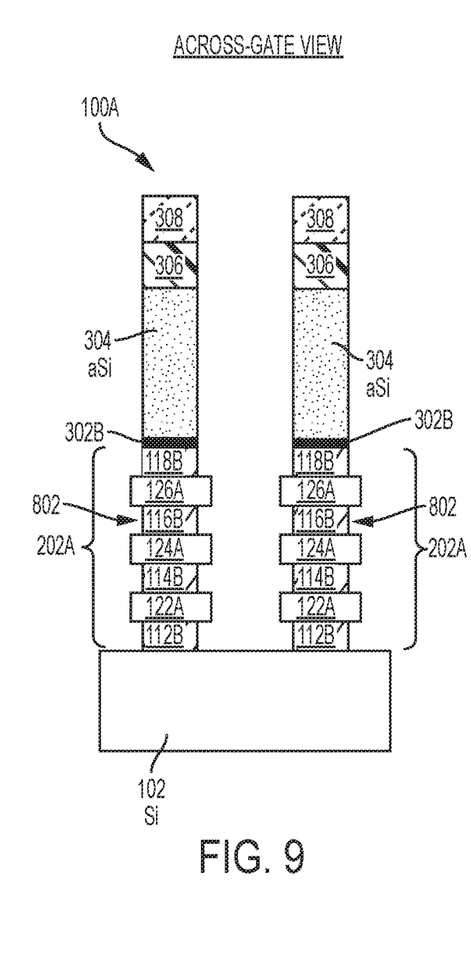
FIG. 9 depicts a cross-sectional, across-the gate view of the semiconductor structure after fabrication stages according to embodiments of the invention.

In FIG. 9, known semiconductor fabrication processes have been used to remove the dummy offset spacers 502A. Portions of the gate dielectric 302A have also been removed to form gate dielectric 302B. In accordance with aspects of the invention, the dummy spacers 502A (shown in FIG. 7) were utilized to, in effect, "bookmark" or "reserve" the place for the offset gate spacers 1202 (shown in FIG. 14). In downstream fabrication operations, which are depicted in FIGS. 10-14, the dummy offset gate spacers 502A are replaced with two-segment outer spacers 1202 and inner spacers 902C. In embodiments of the invention, the upper segment 1102a of the two-segment offset gate spacer 1202 is a different material than the lower segment 902B of the two-segment offset gate spacer 1202 and the lower segment 902B is the same material as the inner spacer 902C. The likelihood of gate pinch-off is reduced and spacer structural integrity is increased by utilizing a self-aligned spacer etch (shown in FIG. 14) to remove the excess inner spacer material covering the Si channel nanosheets 122B, 124B, 126B with selectivity to the upper segment 1102A. The selectivity of the self-aligned spacer etch is facilitated because the upper segment 1102A is different material than the lower segment 902B and the inner spacer 902C.

Figure 10:
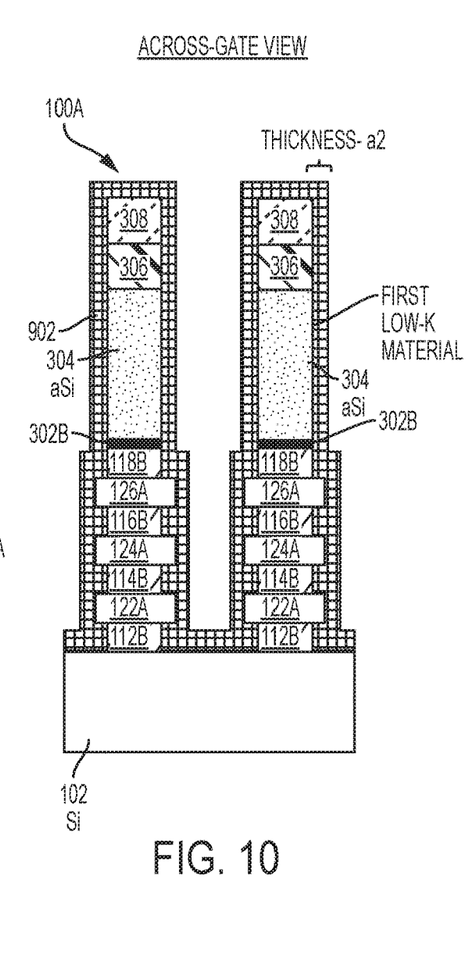
FIG. 10 depicts a cross-sectional, across-the gate view of the semiconductor structure after fabrication stages according to embodiments of the invention.

In FIG. 10, known semiconductor fabrication processes have been used to deposit a dielectric layer 902 formed from a first low-k material. In embodiments of the invention, the first low-k material fills in the pull back end region cavities 802 (shown in FIG. 9). In embodiments of the invention, the dielectric layer 902 is formed to a thickness a2. In embodiments of the invention, a2 is substantially equal to or slightly smaller than a1, wherein a1 is the thickness of the dummy spacers 502A (shown in FIG. 8) that were utilized to, in effect, "bookmark" or "reserve" the place for the offset gate spacers 1202 (shown in FIG. 14). Expressed as a percentage, a2 qualifies as being slightly smaller than a1 if a2 is less than a1 and within about 20% of a1.

Figure 11:
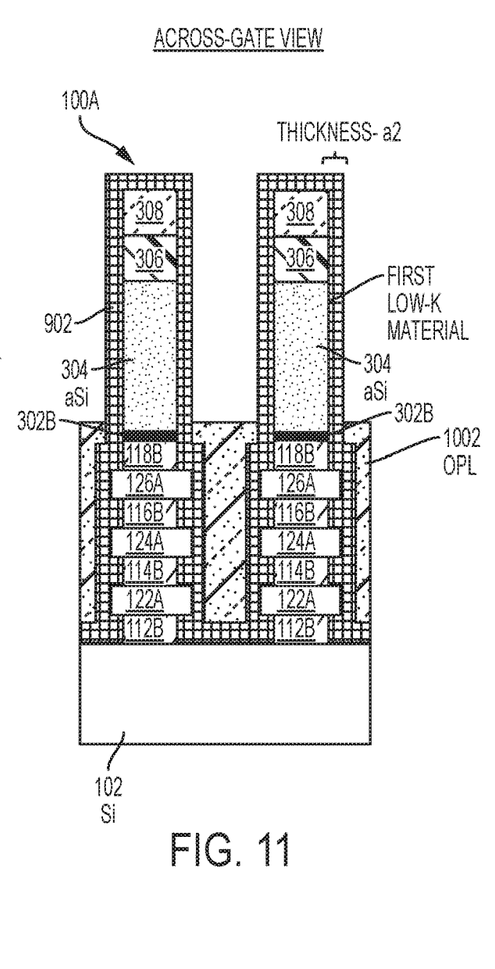
FIG. 11 depicts a cross-sectional, across-the gate view of the semiconductor structure after fabrication stages according to embodiments of the invention.

In FIG. 11, known semiconductor fabrication processes have been used to deposit an organic planarization layer (OPL) 1002 and recess it to a predetermined level as shown. In embodiments of the invention, the predetermined level of the OPL 1002 will be used in downstream fabrication operations to define the interface between the upper segment 1102A and the lower segment 902B of the two-component offset gate spacers 1202 (shown in FIG. 14). In embodiments of the invention, the predetermined level is above the top nanosheet (i.e., sacrificial nanosheet 118B). In general, OPLs are used as etch masks for pattern transfers into inorganic substrates, to fill pre-existing features, and to planarize the substrate to allow for larger patterning process windows.

Figure 12:
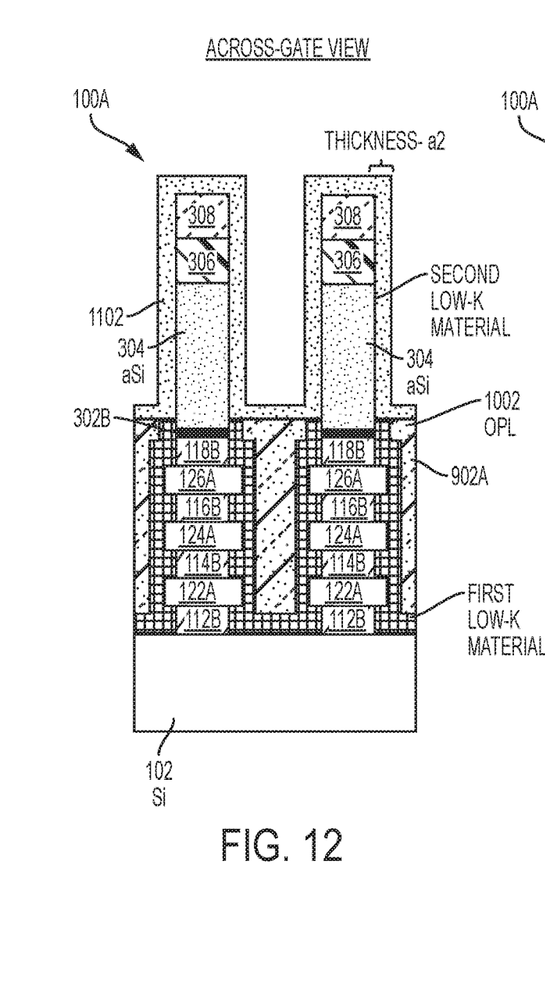
FIG. 12 depicts a cross-sectional, across-the gate view of the semiconductor structure after fabrication stages according to embodiments of the invention.

In FIG. 12, known semiconductor fabrication processes have been used to strip the exposed portions of the dielectric layer 902, leaving behind dielectric layer 902A. Also shown in FIG. 12, known semiconductor fabrication operations have been used to deposit a dielectric layer 1102 formed from a second low-k material (e.g., LTO, SiOC, and the like). In embodiments of the invention, the dielectric layer 1102 is formed to about the thickness a2. In embodiments of the invention, a2 is substantially equal to or slightly smaller than a1, wherein a1 is the thickness of the dummy spacers 502A (shown in FIG. 8) that were utilized to, in effect, "bookmark" or "reserve" the place for the offset gate spacers 1202 (shown in FIG. 14). Expressed as a percentage, a2 qualifies as being slightly smaller than a1 if a2 is less than a1 and within about 20% of a1.

Figure 13:
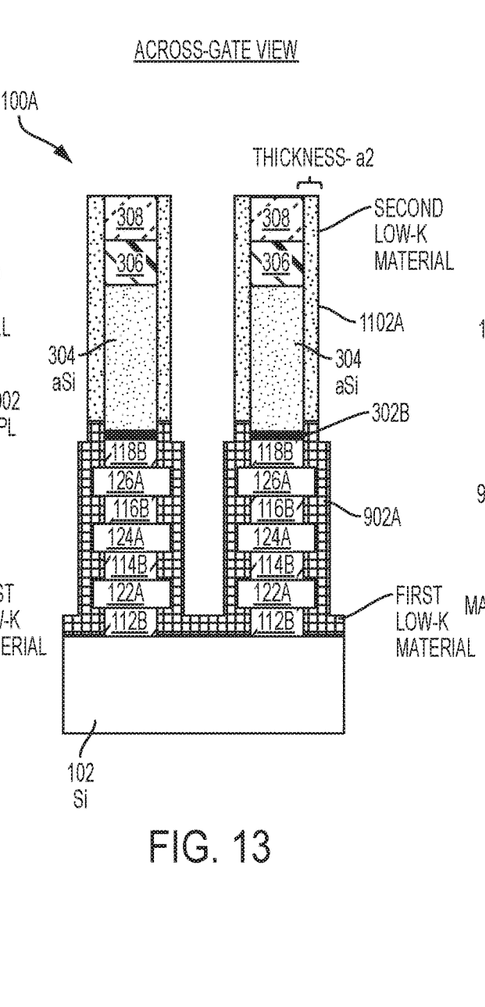
FIG. 13 depicts a cross-sectional, across-the gate view of the semiconductor structure after fabrication stages according to embodiments of the invention.

In FIG. 13, known semiconductor fabrication processes have been applied to remove selected portions of the dielectric layer 1102 and the entire OPL 1002. In embodiments of the invention, the known semiconductor fabrication processes include multiple removal processes. In embodiments of the invention, one of the removal processes is a directional etch selective to the second type of low-k material, which is tailored (e.g., timed) to remove the portions of the dielectric layer 1102 that cover the OPL region 1002 and the hard masks 308. After applying the direction etch to the dielectric layer 902, a dielectric layer 1102A remains, and top surfaces of the OPL regions 1002 are exposed. In another of the removal processes, the OPL region 1002 is removed using a removal process that is selective to the OPL material. In embodiments of the invention, the OPL region 1002 can be removed by a dry removal process such as a reactive ion etch (RIE) or plasma ash.

Figure 14:
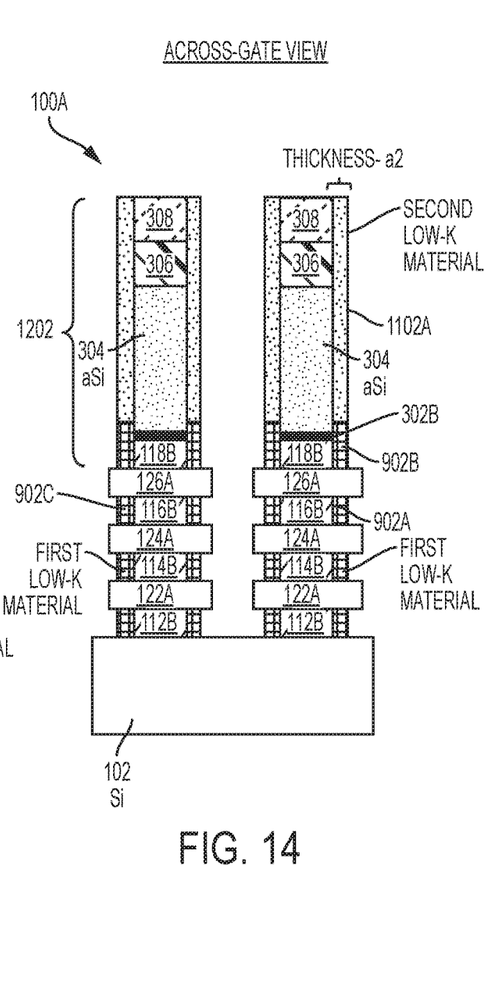
FIG. 14 depicts a cross-sectional, across-the gate view of the semiconductor structure after fabrication stages according to embodiments of the invention.

In FIG. 14, in accordance with embodiments of the invention a self-aligned spacer etch has been applied to remove the excess portions of the dielectric layer 902A (shown in FIG. 13) that are not covered by the dielectric layer 1102A or the end regions of the channel nanosheets 122A, 124A, 26A, thereby resulting in the formation of dielectric layers 902B and inner spacers 902C. Forming the upper and lower segments (1102A, 902B) of the offset gate spacers 1202 from low-k materials reduces the gate to S/D capacitance. Forming the inner spacers 902C from low-k material also reduces the gate to S/D capacitance. In embodiments of the invention, the self-aligned spacer etch includes a directional etch selective to the first type of low-k material. Because the dielectric layer 1102A is a different material (e.g., the second low-k material) than the dielectric layer 902A (e.g., the first low-k material) (shown in FIG. 13), the formation of dielectric layer 902B can be defined by (or aligned by) the dielectric layer 1102A. Similarly, because the end regions of the nanosheet channels 122A, 124A, 126A are a different material (e.g., Si) than the dielectric layer 902A (e.g., the first low-k material) (shown in FIG. 13), the formation of inner spacers 902C can be defined by (or aligned by) the end regions of the nanosheet channels 122A, 124A, 126A. Accordingly, the thickness of the dielectric layer 902B is determined by the thickness a2 of the dielectric layer 1102A, and the thicknesses of the inner spacers 902C are determined by the thicknesses of the end region cavities 802 (shown in FIG. 8). In embodiments of the invention, the likelihood of gate pinch-off is reduced and spacer structural integrity is increased by utilizing the above-described self-aligned spacer etch. In embodiments of the invention, the self-aligned spacer etch is of sufficient duration to remove the dielectric layer 902A from end sidewalls of the channel nanosheets 122A, 124A, 126A.

In accordance with embodiments of the invention, the fabrication operations depicted in FIGS. 13 and 14 result in the formation of the two-segmented offset gate spacers 1202 and inner spacers 902C. The two-segmented offset gate spacers 1202 are formed from an upper segment 1102A that includes a second type of low-k material, along with a lower segment 902B that includes a first type of low-k material. of the lower segment. The inner spacers 902C are also formed from the first type of low-k material. In embodiments of the invention, the lower segment 902B of the two-segment outer spacers 1202 is the same material as the inner spacers 902C.

In general, a material is considered low-k when its k-value or dielectric constant is similar to or less than the k-value of $SiO_2$, which is generally accepted to be about 3.9. However, for gate spacer applications formed from SiN to provide greater process control, materials with k-values lower than SiN could be considered as low-k spacer material. The k-value of SiN is about 7.0. In embodiments of the invention, the first type of low-k material can be a dielectric material having a dielectric constant in the range from about 4 to about 6. Examples of the first type of low-k material includes but is not limited to SiBCN, SiOCN, and the like. In embodiments of the invention, the second type of low-k material can be a dielectric material having a dielectric constant in the range from about 2 to about 6. Examples of the second type of low-k material includes but is not limited to SiOCN, SiOC, SiCOH, and the like, with the caveat that the second type of low-k material is different than the first type of low-k material.

Figure 15:
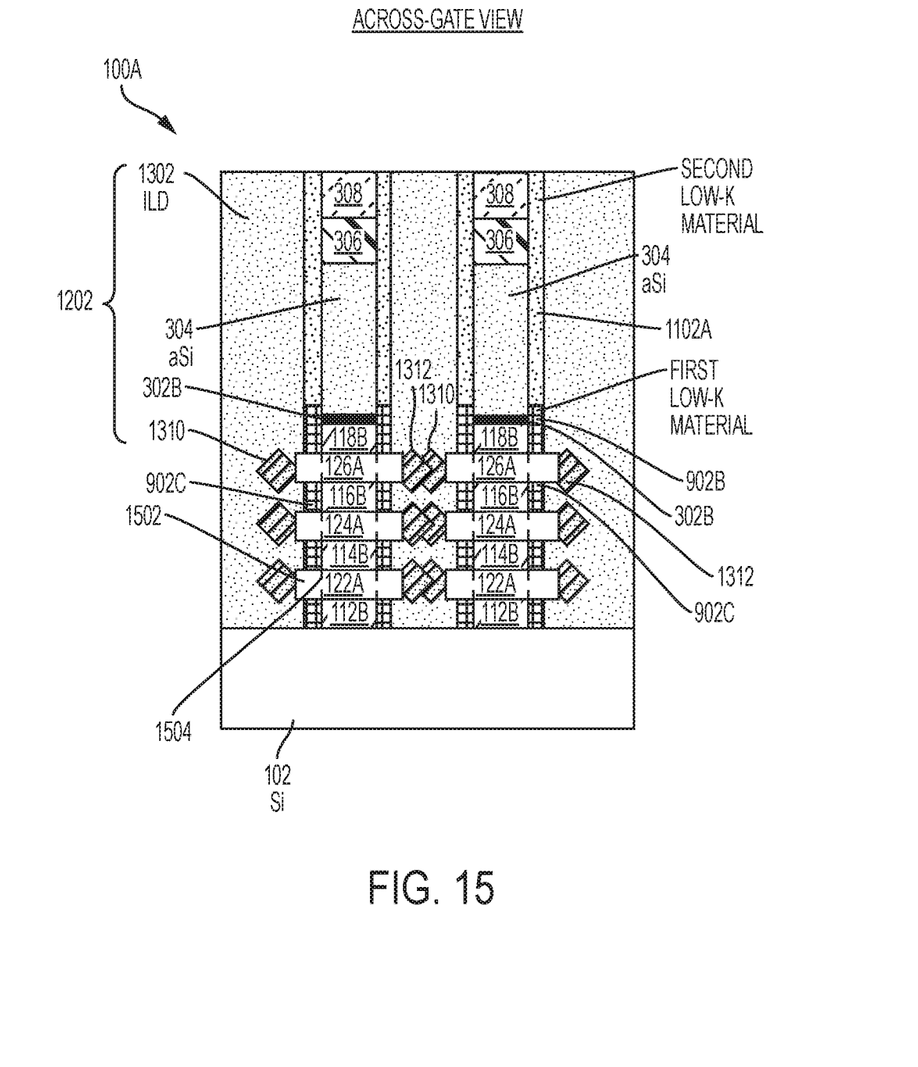
FIG. 15 depicts a cross-sectional, across-the gate view of the semiconductor structure after fabrication stages according to embodiments of the invention.

In FIG. 15, known semiconductor device fabrication processes have been used to form source/drain (S/D) regions 1310, 1312. In embodiments of the invention, the S/D regions 1310, 1312 are formed using an epitaxial layer growth process on the exposed sidewalls of the Si channel nanosheet regions 122A, 124A, 126A. In-situ doping (ISD) can be applied to form doped S/D regions 1310, 1312, thereby creating the necessary junctions in the nanosheet transistors 140, 140A (shown in FIG. 1). Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

In embodiments of the invention, the epitaxial growth and in-situ doping used to form the S/D regions 1310, 1312 are controlled in a manner that forms extension regions 1502 having extension junctions 1504 within the Si channel nanosheet regions (e.g., Si nanosheet regions 126A, 126D). For ease of illustration, only one example of the extension regions 1502 and extension junctions 1504 are provided with reference numbers. Extension regions 1502 and extension junctions 1504 extend under two-segmented offset gate spacers 1202, and the regions of the Si channel nanosheets 122A, 124A, 126A under the gate dummy gates 304 remain undoped. In embodiments of the invention, the doping of extension regions 1502 can be performed by implanting the end regions of the Si channel nanosheet regions 122A, 124A, 126A with ions (or dopants) (e.g., through epitaxy or through ion implantation). Extension junctions 1502 reduce the $R_{ext}$ of the nanosheet transistors 140, 140A (shown in FIG. 1) when they are turned on by applying the appropriate gate bias voltages. The extension junctions 1502 also form a conducting path between the S/D regions 1310, 1312 and the Si channel nanosheet regions 122A, 124A, 126A. In order to optimize transistor performance, the extension junctions 1504 can be positioned such that they terminate in substantially the same plane that the final SG metal gate structure 1406 (shown in FIG. 1) and/or the final work function metal (WFM) gate structure 1404 (shown in FIG. 2) begin.

Referring still to FIG. 15, known semiconductor fabrication operations have been used to form an interlayer dielectric (ILD) region 1302. The ILD region 1302 can be formed by depositing an oxide material in bulk (e.g., silicon dioxide) and polishing the bulk oxide back (e.g., using CMP) to the level of the upper segment 1102A and the hard masks 308.

Referring back to FIG. 1, known semiconductor fabrication operations have been used to remove the dummy gates 304 and the hard masks 306, 308. In embodiments of the invention, the dummy gates 304 and the hard masks 306, 308 can be removed by a known etching process, e.g., RIE or chemical oxide removal (COR). Additionally, known semiconductor fabrication operations have been used to remove the SiGe sacrificial nanosheet central regions 112B, 114B, 116B, 118B (shown in FIG. 15). In embodiments of the invention, the SiGe sacrificial nanosheet central regions 112B, 114B, 116B, 118B can be removed by applying a selective etch (e.g., a hydrochloric acid (HCl)).

In FIG. 1, known semiconductor fabrication processes (e.g., a gate-late fabrication process) have been used to replace the removed dummy gates 304, hard masks 306, 308, gate dielectric 302B, and sacrificial nanosheets 112B, 114B, 116B, 118B with a multi-segmented metal gate structure 1404, 1406 and a relatively thin (e.g., from about 1 nm to about 3 nm) gate dielectric (e.g., high-k (HK)) layer 1402. In embodiments of the invention, the relatively thin gate dielectric layer 1402 can be formed from a hafnium-based material. In embodiments of the invention, the gate metal structure 1404 can include a metal liner, e.g., a WFM 1404. In embodiments of the invention, the WFM 1404 can be, for example, TiN or TaN. In embodiments of the invention, the metal gate structure 1406 can be a metal gate formed from, e.g., aluminum or tungsten. The multi-segmented metal gate structure 1404, 1406 and the relatively thin gate dielectric layer 1402 surround the stacked Si nanosheet channel regions 122A, 124A, 126A and regulate electron flow through the Si nanosheet channel regions 122A, 124A, 126A between the source 1310 and the drain 1312. In order to optimize transistor performance, the extension junctions 1504 can be positioned such that they terminate in the same plane that the final SG metal gate structure 1404, 1406 begins.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
  performing fabrication operations to form a nanosheet field effect transistor (FET) device on a substrate, wherein the fabrication operations include:
    forming gate spacers along a gate region of the nanosheet FET device;
    wherein each of the gate spacers comprises an upper segment and a lower segment;
  wherein forming the gate spacers comprises:
    forming dummy gate spacers along the gate region of the nanosheet FET device;
    using the dummy gates spacers as masks to remove portions of channel nanosheets of the nanosheet FET device; and
    replacing the dummy gate spacers with the gate spacers;

wherein replacing the dummy gate spacers with the gate spacers comprises:
  forming a layer of the first type of material along the gate region of the nanosheet FET device; and
  replacing an upper region of the layer of the first type of material with a layer of the second type of material;
  wherein the layer of the second type of material comprises the upper segment of the gate spacer; and
wherein replacing the dummy gate spacers with the gate spacers further comprises forming the lower segment of the gate spacer by using the upper segment of the gate spacer as a mask for removing portions of a lower region of the layer of the first type of material.

2. The method of claim 1, wherein:
the upper segment comprises a second type of material; and
the lower segment comprises a first type of material.

3. The method of claim 1, wherein the first type of material comprises a first type of low-k material.

4. The method of claim 3, wherein the second type of material comprises a second type of low-k material.

5. The method of claim 2, wherein the fabrication operations further comprise forming inner spacers between channel nano sheets of the nanosheet FET device.

6. The method of claim 5, wherein inner spacers comprise the first type of material.

7. The method of claim 6, wherein the first type of material comprises a first type of low-k material.

8. The method of claim 7, wherein the second type of material comprises a second type of low-k material.

9. A method of fabricating a semiconductor device, the method comprising:
  performing fabrication operations to form a nanosheet field effect transistor (FET) device on a substrate, wherein the fabrication operations include:
    forming gate spacers along a gate region of the nanosheet FET device; and
    forming inner spacers between channel nanosheets of the nanosheet FET device;
  wherein each of the gate spacers comprises an upper segment and a lower segment;
  wherein the upper segment comprises a second type of material;
  wherein the lower segment comprises a first type of material;
  wherein inner spacers comprise the first type of material;
wherein forming the gate spacers comprises:
  forming dummy gate spacers along the gate region of the nanosheet FET device;
  using the dummy gates spacers as masks to remove portions of channel nanosheets of the nanosheet FET device; and
  replacing the dummy gate spacers with the gate spacers;
wherein replacing the dummy gate spacers with the gate spacers comprises:
  forming a layer of the first type of material along the gate region of the nanosheet FET device; and
  replacing an upper region of the layer of the first type of material with a layer of the second type of material;
  wherein the layer of the second type of material comprises the upper segment of the gate spacer; and
wherein replacing the dummy gate spacers with the gate spacers further comprises forming the lower segment of the gate spacer by using the upper segment of the gate spacer as a mask for removing portions of a lower region of the layer of the first type of material.

10. The method of claim 9, wherein:
the first type of material comprises a first type of low-k material; and
the second type of material comprises a second type of low-k material.

* * * * *